US008559656B2

(12) United States Patent
Shu et al.

(10) Patent No.: US 8,559,656 B2
(45) Date of Patent: Oct. 15, 2013

(54) SYSTEM AND METHOD FOR AUTOMATIC MICROPHONE VOLUME SETTING

(75) Inventors: Chang-Qing Shu, Orlando, FL (US); Dezhi Liao, Orlando, FL (US)

(73) Assignee: Adacel Systems, Inc., Orlando, FL (US)

( * ) Notice: Subject to any disclaimer, the term of this patent is extended or adjusted under 35 U.S.C. 154(b) by 674 days.

(21) Appl. No.: 12/835,440

(22) Filed: Jul. 13, 2010

(65) Prior Publication Data

US 2012/0014537 A1    Jan. 19, 2012

(51) Int. Cl.
*H03G 3/00* (2006.01)
*H04M 9/08* (2006.01)
*H04L 27/08* (2006.01)

(52) U.S. Cl.
USPC ............. 381/107; 379/406.02; 375/345

(58) Field of Classification Search
USPC ................ 381/104, 107, 57–58, 94.8; 704/225–226; 379/406.02; 375/345
See application file for complete search history.

(56) References Cited

U.S. PATENT DOCUMENTS

| | | | | |
|---|---|---|---|---|
| 5,822,718 A | * | 10/1998 | Bakis et al. | ............ 702/180 |
| 5,844,994 A | * | 12/1998 | Graumann | ............ 381/56 |
| 5,949,886 A | | 9/1999 | Nevins et al. | |
| 8,116,485 B2 | * | 2/2012 | Escott et al. | ............ 381/107 |

* cited by examiner

*Primary Examiner* — Xu Mei
*Assistant Examiner* — Ammar Hamid
(74) *Attorney, Agent, or Firm* — Allen, Dyer, Doppelt, Milbrath & Gilchrist, P.A.

(57) ABSTRACT

Optimal microphone volumes are automatically set for computer applications based on determination of peak volume levels and noise levels from one or more digital audio captures. The peak volume levels and noise levels can be advantageously determined based on distribution curves of sample volume levels in the digital audio captures. Clipping can be automatically compensated for by estimating peak unclipped capture volume levels from the distribution curves.

17 Claims, 5 Drawing Sheets

SYSTEM AND METHOD FOR AUTOMATIC MICROPHONE VOLUME SETTING

FIELD OF THE INVENTION

The present invention relates to automatic microphone volume setting by computer systems, and more particularly, to automatic microphone volume setting in connection with speech recognition applications.

BACKGROUND OF THE INVENTION

It is known that the accuracy rate of speech recognition applications is affected by the volume setting of the microphone used to capture the speech. To improve accuracy rate, attempts have made to allow for automatic optimization of the microphone volume. One such attempt is disclosed by U.S. Pat. No. 5,949,886, the contents of which are hereby incorporated by reference in their entirety, wherein volume is optimized by a multi-step process involving the comparison of multiple audio captures taken at different, predetermined volume levels. Depending on noise conditions and the initial microphone volume setting, a user may be required to provide several audio captures to determine the optimal microphone volume setting. Also, the user is required to remain silent for predetermined periods of time to allow for determination of the noise level.

SUMMARY OF THE INVENTION

In view of the foregoing, it is an object of the present invention to provide an improved system and method for automatic microphone volume setting. According to an embodiment of the present invention, an automatic microphone volume setting system includes a computer system connected to a microphone. The computer system has at least one processor and machine-readable memory configured to execute a microphone control module and a digital audio analysis module. The microphone control module is adapted to generate digital audio captures based on inputs from the microphone, and adjust the microphone volume based on microphone volume settings. The digital audio analysis module is adapted to receive the digital audio captures from the microphone control module, generate distribution curves of the digital audio capture sample volume levels, estimate peak unclipped sample volume levels and noise levels from the distribution curves, and generate the microphone settings based on the peak unclipped sample volume and noise levels.

According to a method aspect of the present invention, a method of automatically setting microphone volume includes obtaining at least one digital audio capture and generating, for the at least one digital audio capture, a distribution curve of capture sample absolute volume levels. The distribution curve is analyzed to determine at least one peak unclipped capture volume level and at least one noise level, and a microphone volume setting is selected based on the peak unclipped capture volume and noise levels.

According to another method aspect of the present invention, a method for adjusting a microphone volume setting to eliminate clipping includes generating a distribution curve of sample volume levels for a digital audio capture having clipping, estimating a peak unclipped sample volume level based on an unclipped portion of the distribution curve, and generating a microphone volume setting to bring the peak unclipped sample volume level below a clipping threshold.

According to a further method aspect of the present invention, a method of automatically setting microphone volume includes checking a first audio capture for clipping. If clipping is detected, the first audio sample is analyzed to estimate a clipping magnitude, and the microphone volume setting is adjusted based on the estimated clipping magnitude to eliminate the clipping. At least one clipping-free audio capture is analyzed to determine a peak capture volume level and a noise level, and the microphone volume setting is adjusted based on the peak capture volume level and the noise level.

These and other objects, aspects and advantages of the present invention will be better appreciated in view of the drawings and following description of a preferred embodiment.

DETAILED DESCRIPTION OF A PREFERRED EMBODIMENT

Figure 1:
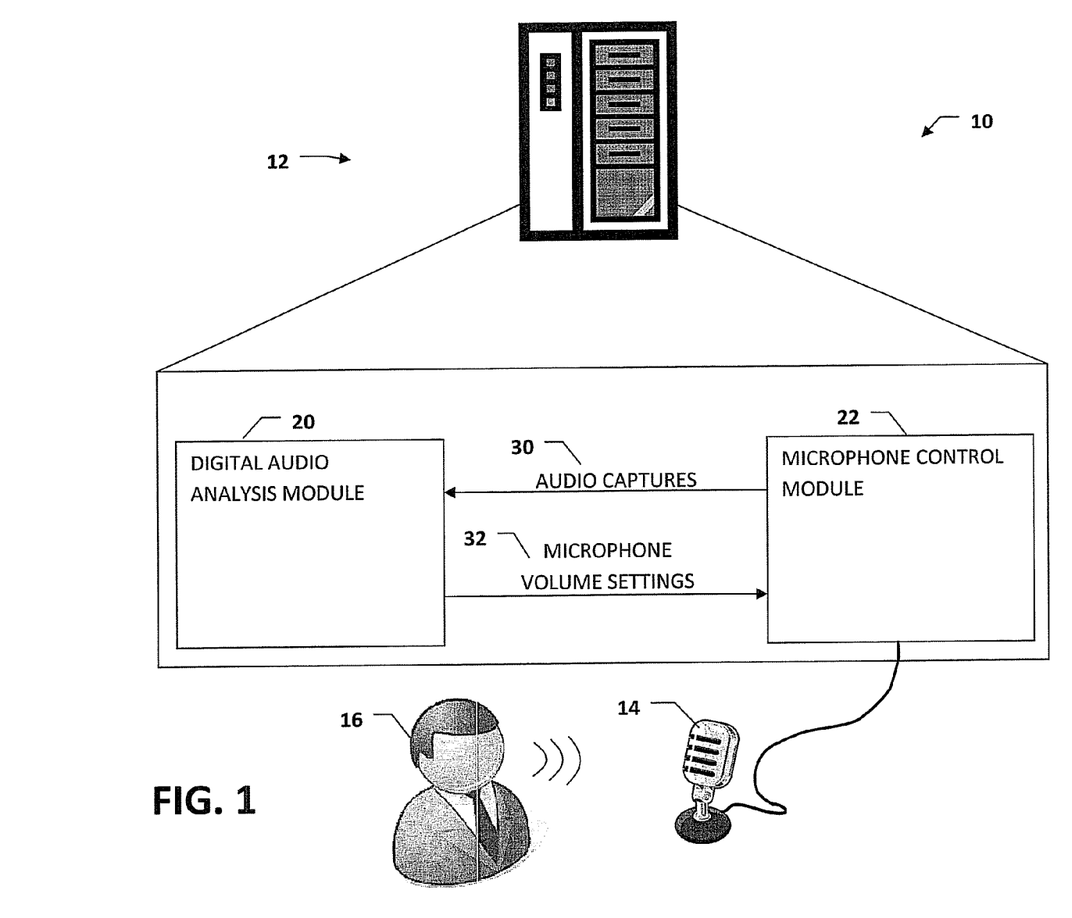
FIG. 1 is a schematic overview of a system for automatic microphone volume setting, according to an embodiment of the present invention.

Referring to FIG. 1, according to an embodiment of the present invention, a system for automatic microphone volume setting 10 includes a computer system 12 connected to a microphone 14. The computer system 12 and microphone 14 are configured to detect sounds produced by user 16, such as speech, along with noise from the user's acoustic environment, and convert the sounds and noise into a digital audio signal representative thereof.

"Computer system," as used herein, generically refers to any microprocessor based device or group of devices capable of connection to a microphone, receipt of audio inputs therefrom, and conversion of the audio inputs into digital audio signals. Non-limiting examples of computer systems include personal computers, cellular phones and other personal electronic devices, and computer-based simulation systems. The present invention is not necessarily limited to particular processor types, numbers or designs, to particular code formats or languages, or to particular hardware or software memory media.

The computer system 12 includes at least one processor and machine-readable memory configured to execute a digital audio (DA) analysis module 20 and a microphone control module 22. The DA analysis module 20 is adapted to receive digital audio captures 30 from the microphone control module 22, and based on analysis of the audio captures 30, generate microphone volume settings 32. The microphone control module 22 is adapted to generate the audio captures 30 from the microphone 14 audio inputs, and communicate the audio captures 30 to the DA analysis module 20. The microphone control module 22 is further adapted to adjust the microphone 14 volume upon receipt of the microphone volume settings 32.

The analysis of the digital audio captures 30, which the DA analysis module 20 is configured to perform, advantageously includes detecting clipping in the captures 30 and estimating a clipping magnitude. The DA analysis module 20 is then able to generate microphone volume settings 32 to eliminate any clipping. The DA analysis module 20 is further configured to analyze the audio captures 30 to determine peak capture volume levels and noise levels, and generate microphone volume settings 32 to optimize the microphone 14 volume setting for a given application.

Figure 2:
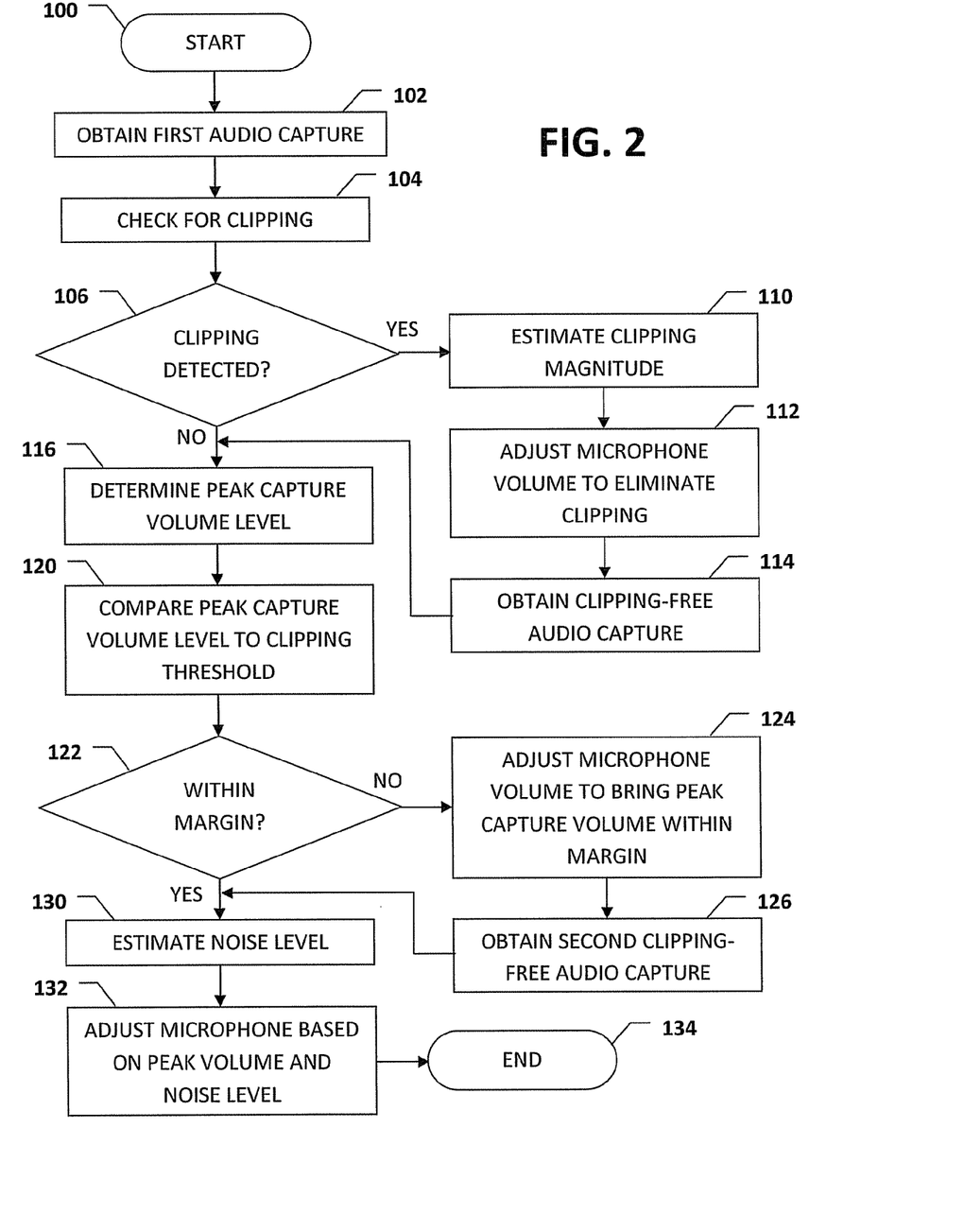
FIG. 2 is a flow diagram of a method of automatically setting microphone volume, according to a method aspect of the present invention.

Referring to FIG. 2, according to a method aspect of the present invention, a method of automatically setting microphone volume starts at block 100. At block 102, a first digital audio capture is obtained and, at block 104, the first audio capture is checked for clipping. If clipping is detected at block 106, then a clipping magnitude is estimated (block 110). Based on the estimated clipping magnitude, at block 112, the microphone volume is adjusted to eliminate clipping. With the microphone volume adjusted, a clipping-free audio capture is obtained (block 114).

After the clipping-free audio capture is obtained, or if clipping was not detected in the first audio capture at block 106, a peak capture volume level is determined at block 116. At block 120, the peak capture volume level is compared to the clipping threshold. If, at block 122, the peak capture volume level is determined to be below a desired margin from the clipping threshold, then the microphone volume is adjusted to raise the peak capture volume level within the desired margin (block 124). Using the adjusted microphone volume, a second clipping-free audio capture is obtained at block 126.

Once the second clipping-free audio capture is obtained, or if the previous clipping-free audio capture was within the desired margin of the clipping threshold at block 122, a noise level is estimated (block 130). Using the peak volume and noise levels, the microphone volume is adjusted at block 132 to optimize performance for a given application. The method ends at block 134.

Figure 3:
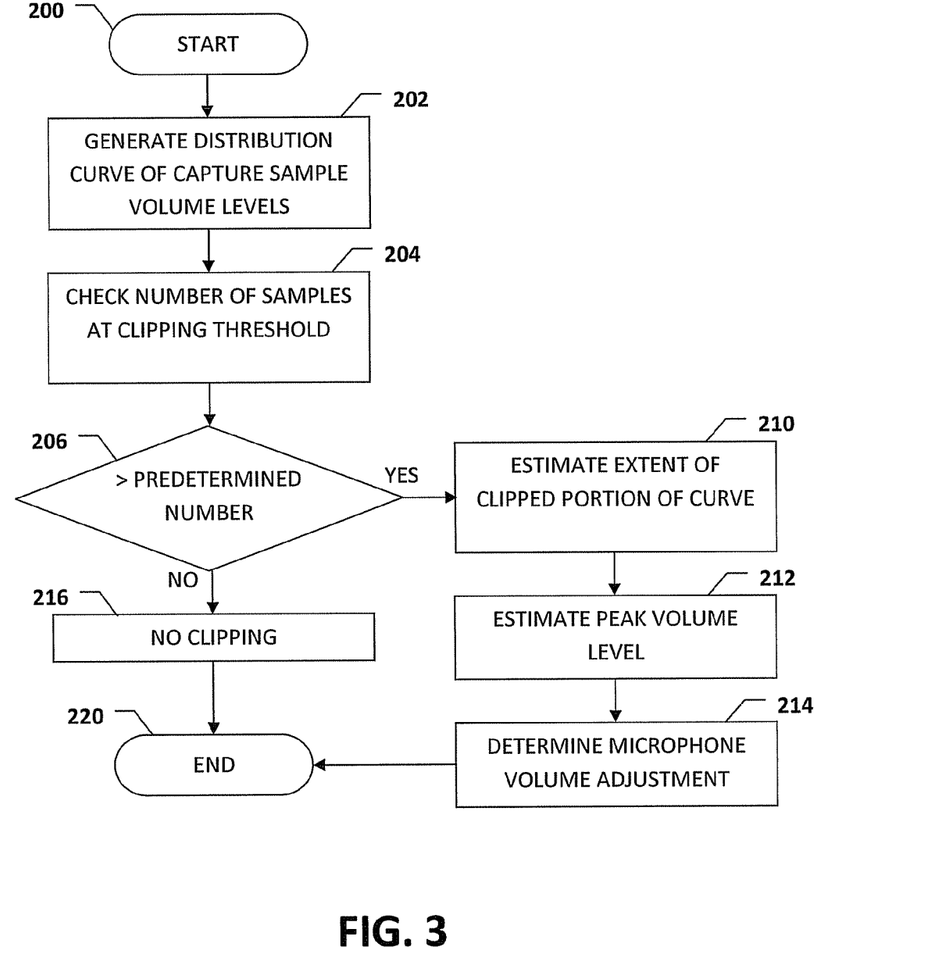
FIG. 3 is a flow diagram of a method of automatically adjusting microphone volume to eliminate clipping, according to a further method aspect of the present invention.

Referring to FIG. 3, according to a further method aspect of the present invention, a method of automatically adjusting microphone volume to eliminate clipping begins at block 200. At block 202, a distribution curve of the volume level of samples within a digital audio capture is generated.

As used herein, a "digital audio capture" refers to a digital audio recording of finite duration generated from analog microphone audio inputs. The present invention is not limited to the use of any particular audio file format. A given digital audio capture is composed of a number of "samples." The number of samples in a given digital audio capture is a function of the duration of the capture and the sampling rate used in the generation of the digital audio capture. For example, a two second digital audio capture generated with at a sampling rate of 44.1 kHz will include 88,200 samples.

Each of the samples generally includes a volume level and a sign (positive or negative). The range of volume levels attributable to a sample will be a function of the resolution used in generating the digital audio capture. For example, a digital audio capture generated with 16-bit resolution can indicate $2^{15}$ unique absolute volume levels, with one bit used to indicate the sign. Each sample will have a noise component and a signal component, the signal component representing the speech or sound made by the user. The signal component of a given sample can be zero if the user is silent during the sample.

Figure 4:
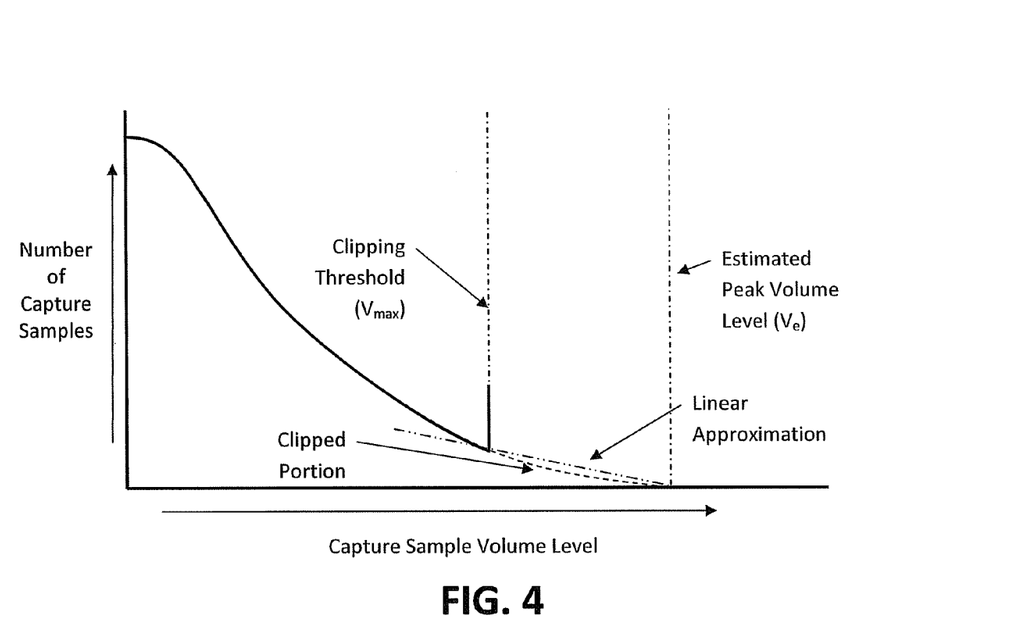
FIGS. 4-6 are distribution graphs of digital audio capture sample volume levels.

The distribution curve is generated by taking the absolute value of each sample, and summing the number of samples at each volume level. An illustrative distribution curve is shown in FIG. 4, where the X-axis is the capture sample volume level and the Y-axis is the number of samples at each volume level. It will be appreciated that an actual distribution "curve" for a given digital audio capture will likely not be perfectly smooth. However, the present inventor has determined that the typical digital audio capture used for microphone testing will generally exhibit a "bell curve" type distribution.

Referring again to FIG. 3, at block 204, the number of samples at a clipping threshold can be determined. Referring again to FIG. 4, it will be seen that there is a discontinuity in the distribution curve at the clipping threshold ($V_{max}$) (compare, e.g., to FIG. 5, where there is no discontinuity in the distribution curve at the clipping threshold). The discontinuity results from all samples in the clipped portion being assigned the volume level of the clipping threshold, rather than their higher actual volume level. Accordingly, the occurrence of clipping can be detected by identifying whether there are greater than a predetermined number of samples at the clipping threshold (FIG. 3, block 206).

Additionally, it will be appreciated that the present inventor's determination that the digital audio capture distribution generally fits a curve will allow a mathematical estimation of the clipping magnitude by estimating an extent of the clipped portion of the distribution curve (block 210), and a corresponding estimation of the unclipped peak volume level of the audio capture (block 212).

Mathematically, the distribution of sample volumes can be described as:

$$\mathrm{Dist}(X) = \Sigma_j (\exp((X-m_j)^2/(2\pi\sigma_j^2))) + \Sigma_k (\exp((X-n_k)/(-\tau_k)));$$

Where X is $|V_i|$ from 0 to $V_{max}$, the Dist(X) is the distribution of the $|V_i|$ that means Dist(X, $X_0 - \delta <= X <= X_0 + \delta$) is the number of the samples in $|V_0| - \delta <= |V_i| <= |V_0| + \delta$. The $m_j$ and $\sigma_j^2$ represent the $j^{th}$ mean and variance of the $j^{th}$ Gaussian and $n_k$ and $\tau_k$ represent the parameters of the $k^{th}$ decay. The $\delta$ is preferably a very small, positive increment of X.

The generated distribution curve will likely not correspond perfectly to this mathematical description of the curve. However, using the actual samples of the digital audio capture, $m_j$, $\sigma_j^2$, $n_k$ and $\tau_k$, can be estimated based on determining a best fit curve relative to the unclipped portion of the actual distribution curve of capture sample volume levels. Using the estimated $m_j$, $\sigma_j^2$, $n_k$ and $\tau_k$, the clipped portion of the curve can be estimated, with the unclipped peak volume level being estimated as the highest volume level having at least one sample associated therewith.

For practical purposes, it is sufficiently accurate to set j=1 and k=1 and simplify the distribution function (to be best fit to the actual distribution curve) to:

$$\mathrm{Dist}(X) \approx \exp((X-m)^2/(2\pi\sigma^2)) + \exp((X-n)/(-\tau)).$$

Moreover, since for the purposes of adjusting microphone volume level to eliminate clipping it is only necessary to have a reasonable approximation of the unclipped peak volume, and not of the entire clipped portion, a best fit linear approximation of the clipped portion can be made based on data from the unclipped portion of the curve adjacent to the clipping threshold. For example:

$$Y_i = kX_i + b;$$

Selecting capture samples using, for instance, $X_i >= \lambda * V_{max}$. Using $\lambda = 0.8$ has been found to yield suitable results (i.e., using the ⅕ of the distribution data closest to the clipping threshold).

By identifying the best fit line for the selected distribution data, values for k and b are determined. This best fit line will generally result in an underestimation of the peak unclipped volume level, with the magnitude of the underestimation normally increasing with the extent of the clipping. An error correction factor β can be introduced to the slope of the line to help offset this underestimation, with β varying depending on the number of samples falling at the clipping threshold. Suggested values for β ranging from about 0.6 to about 0.3, depending on the extent of the clipping have been found suitable by the present inventor.

The resultant equation, Y=βk+X, is solved for Y=0 to estimate the peak unclipped volume level ($V_e$). Referring again to FIG. 3, a microphone volume setting can then be selected to ensure that the peak unclipped volume level would fall within the clipping threshold (block 214). The following equation can be used:

$$S_{nc}=S_0(V_e/V_{max});$$

Where $S_0$ is the microphone volume setting used while capturing the first audio capture, and $S_{nc}$ is the new microphone volume setting selected to eliminate clipping. After block 214, or immediately if no clipping (block 216) was detected at block 206, the method ends at block 220.

Figure 5:
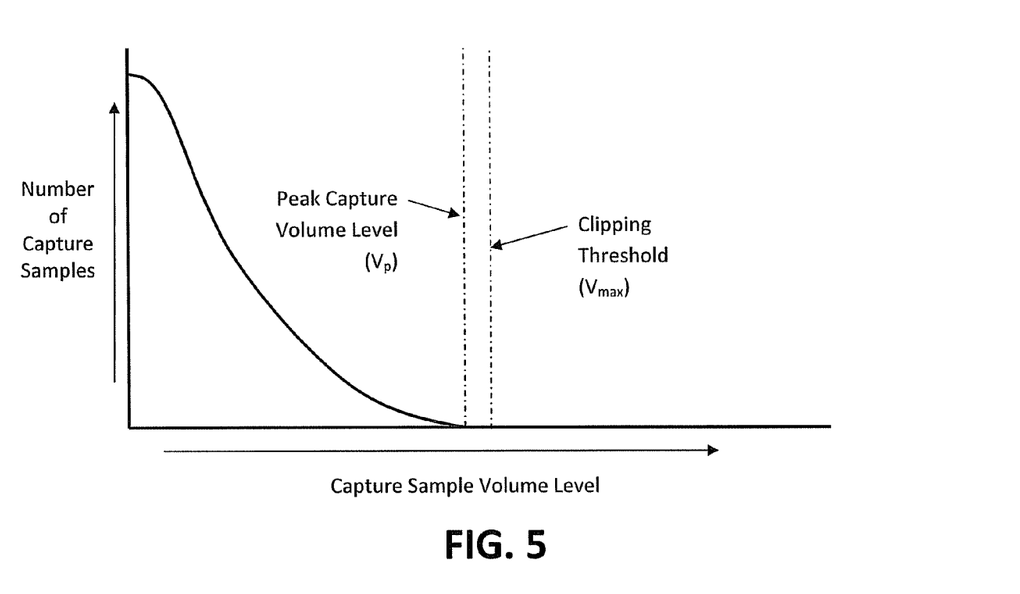

Referring to FIG. 5, an illustrative distribution curve is shown for a clipping-free audio capture. The clipping-free audio capture could be the first audio capture, if no clipping is detected, or a subsequent audio capture taken with microphone volume settings adjusted, as described above. The peak capture volume level ($V_p$) can be defined as the maximum volume level having at least one sample associated therewith, or mathematically:

$$V_p=\text{Max }(|V_i|, i=1, N);$$ where N is the number of samples in the clipping-free audio capture.

FIG. 5 also illustrates an example of the comparison performed at blocks 120 and 122 of FIG. 2. In FIG. 5, the peak capture volume level is lower than the clipping threshold. However, to most accurately estimate the noise level, as will be described below, it is preferred that the peak capture volume level be within a predetermined margin of the clipping threshold. If the peak capture volume is not within the predetermined margin, the microphone volume setting can be adjusted upwardly. The following equation can be used to determine the new microphone volume setting:

$$S_p=S_{cf}(V_{max}/V_p);$$

Where $S_{cf}$ is the microphone volume setting used when recording the first clipping-free audio capture, and $S_p$ is the new microphone volume setting to bring the peak capture volume level within the predetermined margin of the clipping threshold.

Figure 6:
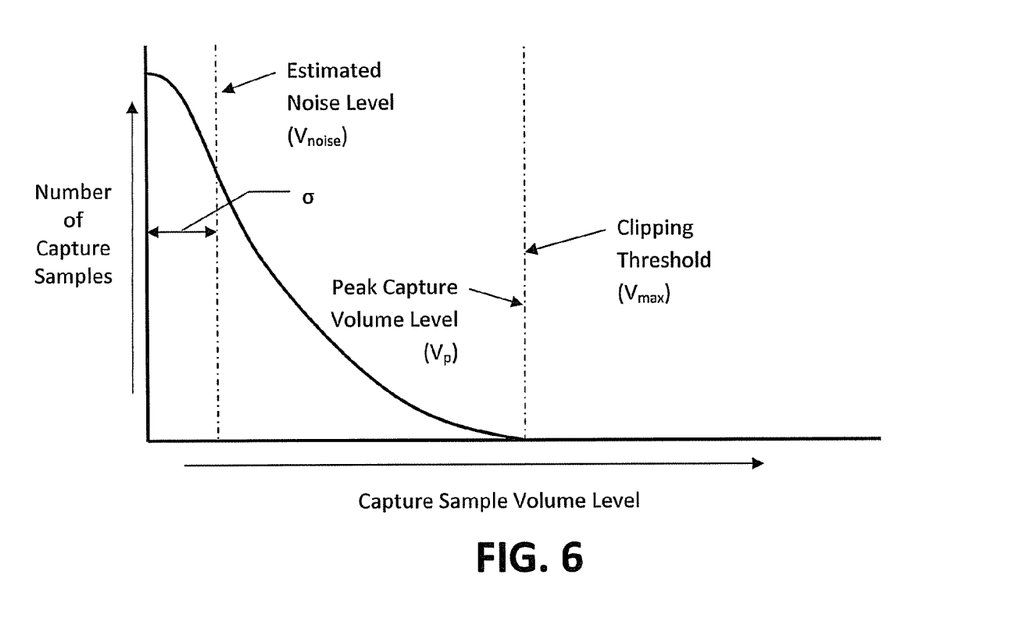

Referring to FIG. 6, an illustrative distribution curve is illustrated where the peak capture volume level is approximately equal to, or at least within a predetermined margin of, the clipping threshold. The present inventor has found that a sufficiently accurate approximation of the noise level ($V_{noise}$) can be determined as a function of the standard deviation (σ) of this distribution curve. In particular, the present inventor has found that the highest sample volume level within one standard deviation generally yields an acceptable approximation of noise level. The standard deviation can be determined from the parameters of the best fit curve, as described above.

Selecting an optimized microphone volume setting can then be performed based on the determined values for peak capture volume level and noise level. The signal-to-noise characteristics of a given microphone over a given volume range can be obtained (these are known characteristics for the microphone, and can be obtained, e.g., from the manufacturer), and could be used to select a microphone volume setting based on an optimal signal to noise ratio (SNR).

However, for the volume range that would be utilized for most speech recognition applications, the signal and noise can both be assumed to increase proportionally with an increase in microphone volume. Also, a given application, such as a given speech recognition application, will often have a known noise level threshold ($V_{noise\_th}$) representing the maximum noise tolerance of the application. Thus, optimizing the microphone volume setting for such an application can practically be performed by adjusting the peak capture volume level as close to the clipping threshold as is possible without exceeding the noise level threshold for the application.

This can be achieved by calculating a noise ratio ($k_{noise}$):

$$k_{noise}=V_{noise\_th}/V_{noise};$$

And a peak volume ratio ($k_p$):

$$k_p=V_{max}/V_p.$$

The optimal microphone volume setting ratio ($k_{opt}$) is defined as the lower of the noise ratio and the peak volume ratio:

$$k_{opt}=\min(k_{noise}, k_p).$$

The microphone volume setting can then be determined as:

$$S_{opt}=S_1*k_{opt};$$

Where $S_1$ is the microphone volume setting for the audio capture used to determine $V_{noise}$ and $V_p$, and $S_{opt}$ is the optimized microphone volume setting. Thus, the present invention offers a system and method for automatically optimizing microphone volume using only three or fewer audio captures, and not requiring a user to remain silent during predetermined periods.

It will be appreciated that all the method steps enumerated above are not necessary for every execution of the method automatically optimizing microphone volume. Also, the steps are not necessarily limited to the sequence described, and that some steps can be performed in other orders, in parallel, or iteratively. For instance, taking three audio captures would normally be done only if clipping were detected in the first audio capture and the peak volume level in the first clipping-free audio capture were not within the predetermined margin of the clipping threshold. If either the first audio capture were clipping-free, or the peak volume of first clipping-free audio capture were within the predetermined margin, only two audio captures would normally be taken. If the first audio capture were clipping free and within the predetermined margin, the first digital audio capture would suffice.

Additionally, while it is believed that the use of up to three audio captures represents a preferred mode for optimizing microphone volume, the present invention could be realized using a maximum of two, or even just one, audio capture. For instance, using substantially the same methods described above, noise level and peak capture volume (either actual or an estimated unclipped peak) could be estimated from the first digital audio capture (whether clipping were present or not), and then used directly to calculate the noise ratio and peak volume ratio in connection with the speech recognition application; thus using only one digital audio capture to set an optimized microphone volume. Likewise, if the noise level and peak capture volume were estimated from the first clipping-free digital audio capture, and then used directly to calculate the noise ratio and peak volume ratio, a maximum of two digital audio captures would be used.

In general, the foregoing description is provided for exemplary and illustrative purposes; the present invention is not necessarily limited thereto. Rather, those skilled in the art will appreciate that additional modifications, as well as adaptations for particular circumstances, will fall within the scope of the invention as herein shown and described and the claims appended hereto.

What is claimed is:

1. A method of automatically setting microphone volume, the method comprising:
checking a first audio capture for clipping;
if clipping is detected, analyzing the first audio capture to estimate a clipping magnitude; and
adjusting the microphone volume setting based on the estimated clipping magnitude to eliminate the clipping;
analyzing at least one clipping-free audio capture to determine a peak capture volume level and a noise level; and
adjusting the microphone volume setting based on the peak capture volume level and the noise level;
wherein analyzing the at least one clipping-free audio capture to determine the peak capture volume level and the noise level includes:
analyzing the first clipping-free audio capture to determine the peak capture volume level of the first clipping-free audio capture;
estimating the noise level from the first clipping-free audio capture, unless the peak capture volume of the first clipping-free audio capture is outside a predetermined margin of a clipping threshold;
if the peak capture volume of the first clipping-free audio capture is outside of the predetermined margin, adjusting the microphone volume setting to bring the peak capture volume within the predetermined margin of the clipping threshold;
obtaining a second clipping-free audio capture at the adjusted microphone volume setting; and
determining the noise level from the second clipping-free audio capture.

2. A method of automatically setting microphone volume, the method comprising:
checking a first audio capture for clipping;
if clipping is detected, analyzing the first audio capture to estimate a clipping magnitude; and
adjusting the microphone volume setting based on the estimated clipping magnitude to eliminate the clipping;
analyzing at least one clipping-free audio capture to determine a peak capture volume level and a noise level; and
adjusting the microphone volume setting based on the peak capture volume level and the noise level;
wherein, if clipping is detected, analyzing the first audio capture to estimate the clipping magnitude includes:
analyzing a distribution curve of sample volumes of the first audio capture to estimate a clipping-affected portion of the distribution curve; and
estimating a peak, unclipped sample volume level based on the estimated clipping-affected portion.

3. The method claim 2, wherein analyzing a distribution curve of sample volumes of the first audio capture to estimate the clipping-affected portion of the distribution curve includes generating a linear approximation of the clipping-affected portion based on a predetermined number of samples adjacent a clipping threshold.

4. The method of claim 3, wherein generating the linear approximation of the clipping-affected portion includes applying an error correction factor based upon a number of samples falling at the clipping threshold.

5. A method of automatically setting microphone volume, the method comprising:
checking a first audio capture for clipping;
if clipping is detected, analyzing the first audio capture to estimate a clipping magnitude; and
adjusting the microphone volume setting based on the estimated clipping magnitude to eliminate the clipping;
analyzing at least one clipping-free audio capture to determine a peak capture volume level and a noise level; and
adjusting the microphone volume setting based on the peak capture volume level and the noise level;
wherein analyzing the at least one clipping-free audio sample to determine the noise level includes:
analyzing a distribution curve of the least one clipping-free audio sample to determine a standard deviation thereof; and
estimating the noise level as a function of the standard deviation.

6. The method of claim 5, wherein the noise level is estimated to be a highest sample volume level within one standard deviation.

7. A method of automatically setting microphone volume, the method comprising:
checking a first audio capture for clipping;
if clipping is detected, analyzing the first audio capture to estimate a clipping magnitude; and
adjusting the microphone volume setting based on the estimated clipping magnitude to eliminate the clipping;
analyzing at least one clipping-free audio capture to determine a peak capture volume level and a noise level; and
adjusting the microphone volume setting based on the peak capture volume level and the noise level;
wherein adjusting the microphone volume setting based on the peak capture volume level and the noise level includes:
identifying a noise level threshold for an application using the microphone; and
adjusting the microphone volume setting to achieve a highest peak capture volume level possible without exceeding the noise level threshold.

8. The method of claim 7, wherein adjusting the microphone volume setting to achieve a highest peak capture volume level possible without exceeding the noise level threshold includes:
determining a noise ratio as the ratio of the noise level to the noise level threshold;
determining a peak volume ratio as the ratio of the peak capture volume level to a clipping threshold;
selecting a microphone volume setting ratio as a lower of the noise ratio and the peak volume ratio;
determining a new microphone volume setting as a product of the current microphone volume setting and the microphone volume setting ratio; and
adjusting the microphone volume to the new microphone volume setting.

9. A method of automatically setting microphone volume, the method comprising:
obtaining at least one digital audio capture;
generating, for the at least one digital audio capture, a distribution curve of capture sample absolute volume levels;
analyzing the distribution curve to determine at least one peak unclipped capture volume level and at least one noise level; and
selecting a microphone volume setting based on the peak unclipped capture volume and noise levels;
wherein, if clipping is detected in the at least one digital audio capture, the at least one peak unclipped capture volume level is estimated from characteristics of an unclipped portion of the distribution curve for the at least one digital audio capture.

10. The method of claim 9, wherein a maximum of three digital audio captures are obtained prior to selecting the microphone volume setting.

11. The method of claim 10, wherein a maximum of two digital audio captures are obtained prior to selecting the microphone volume setting.

12. The method of claim 11, wherein only one digital audio capture is obtained prior to selecting the microphone volume setting.

13. The method of claim 9, wherein, if clipping is detected in the at least one digital audio capture, at least a second digital audio capture is obtained at a microphone volume setting selected to eliminate clipping based on the estimated peak unclipped capture volume level.

14. A method of automatically setting microphone volume, the method comprising:
  obtaining at least one digital audio capture;
  generating, for the at least one digital audio capture, a distribution curve of capture sample absolute volume levels;
  analyzing the distribution curve to determine at least one peak unclipped capture volume level and at least one noise level; and
  selecting a microphone volume setting based on the peak unclipped capture volume and noise levels;
  wherein, if the at least one peak unclipped capture volume level is below a predetermined margin from a clipping threshold, at least a second digital audio capture is obtained at a microphone volume setting selected to bring the peak unclipped capture volume level with the predetermined margin.

15. A method for adjusting a microphone volume setting to eliminate clipping, the method comprising:
  generating a distribution curve of sample volume levels for a digital audio capture having clipping;
  estimating a peak unclipped sample volume level based on an unclipped portion of the distribution curve; and
  generating a microphone volume setting to bring the peak unclipped sample volume level below a clipping threshold.

16. The method of claim 15, wherein estimating the peak unclipped sample volume level based on an unclipped portion of the distribution curve includes:
  generating a best fit mathematical model of the unclipped portion including at least one of: a best fit line and a best fit curve;
  estimating the peak unclipped sample volume from a portion the best fit model extending past the clipping threshold.

17. The method of claim 16, wherein the best fit mathematical model is a best fit line, and an error correction factor is applied to the best fit line based on a number of samples falling at the clipping threshold.

* * * * *